United States Patent [19]

Baumbaugh et al.

[11] Patent Number: 4,751,572
[45] Date of Patent: Jun. 14, 1988

[54] HIGH SPEED DATA COMPACTOR

[75] Inventors: Alan E. Baumbaugh, Batavia; Kelly L. Knickerbocker, Aurora, both of Ill.

[73] Assignee: The United States of America as represented by the United States Department of Energy, Washington, D.C.

[21] Appl. No.: 947,925

[22] Filed: Dec. 30, 1986

[51] Int. Cl.$^4$ .............................................. H04N 7/12
[52] U.S. Cl. .................................... 358/133; 358/260; 375/122
[58] Field of Search ................ 358/133, 260; 375/122; 381/51; 371/52; 382/56; 364/518

[56] References Cited

U.S. PATENT DOCUMENTS

| | | | |
|---|---|---|---|
| 3,980,809 | 9/1976 | Cook | 358/260 |
| 4,057,834 | 11/1977 | Nakagome et al. | 358/133 |
| 4,158,856 | 6/1979 | Tucker | 358/133 |
| 4,598,372 | 7/1986 | McRoberts | 358/133 X |

Primary Examiner—Howard W. Britton
Assistant Examiner—Victor R. Kostak
Attorney, Agent, or Firm—Paul A. Gottlieb; Joseph Krause; Judson R. Hightower

[57] ABSTRACT

A method and apparatus for suppressing from transmission, non-informational data words from a source of data words such as a video camera. Data words having values greater than a predetermined threshold are transmitted whereas data words having values less than a predetermined threshold are not transmitted but their occurrences instead are counted. Before being transmitted, the count of occurrences of invalid data words and valid data words are appended with flag digits which a receiving system decodes. The original data stream is fully reconstructable from the stream of valid data words and count of invalid data words.

6 Claims, 2 Drawing Sheets

HIGH SPEED DATA COMPACTOR

CONTRACTUAL ORIGIN OF THE INVENTION

The U.S. Government has rights in this invention pursuant to Contract No. DE-AC02-76CH03000 between the Department of Energy and University Research Associates, Inc.

BACKGROUND OF THE INVENTION

This invention relates to data compression schemes. In particular, this invention is a means for non-destructively compacting a stream of binary digital data words.

In many applications where a stream of binary digital data words carries a substantially large proportion of non-informational data words and correspondingly a very small percentage of informational data words, it is desirable to be able to suppress or exclude those data bytes which carry no information. Many data compresssion schemes have been proposed for various purposes and have been found successful for the applications for which they were intended.

As for example, U.S. Pat. No. 4,520,506 to Chan et al. which discloses a Method and System for Compression and Reconstruction of Cultural Data for use in a Digital Moving Map Display. Cultural features of terrain are stored as lines which are in the form of beginning addresses and x and y increments to the end of the line.

U.S. Pat. No. 4,365,273 to Yamada et al. discloses a method of compressing picture data by comparing individual elements of a picture with all adjacent picture elements and skipping adjacent and equal picture elements.

U.S. Pat. No. 4,369,463 to Anastassiou et al. discloses a method and apparatus for compacting image data using an adaptive differential pulse code modulation scheme.

U.S. Pat. No. 4,536,801 issued to Torkelson et al. discloses a method and apparatus to compress a video image by scanning the image, identifying adjacent picture elements that are similar and deleting unnecessary duplicate elements.

U.S. Pat. No. 4,531,189 to Mosier et al. discloses a data compression scheme for image data whereby an informational data byte and its numerical position in the data stream is transferred to a microcomputer which further compresses the data by "vectorizing" data into groupings of line segments.

U.S. Pat. No. 4,355,306 to Mitchell discloses an image data compression scheme of run-length coding. In some technical or scientific data acquistion systems where it is desirable to completely reconstruct the original data stream from the compacted stream, data compression schemes such as those above may be inappropriate. In data acquisition systems for scientific experimentation, loss of valid data due to a loss of data in the compression technique might invalidate or nulify the validity of costly experiments.

For example, at the Fermilab Accelerator, images obtained from a scintillating glass fiber-optic target used for studying high energy physics interactions are recorded by a video camera, the output of which is digitized, then stored. Large numbers of the digitized pixels carry no information because the original image is mostly black with a few bright pixels being the image of interest. Loss of "pixel data" is intolerable and the loss of "black data" is also intolerable because the original analog image must be fully reconstructable. However, storing large numbers of black pixels unnecessarily wastes space on whatever medium is used to save the digitized picture. The ability to reduce the number of non-informational data words would be useful to reduce storage of large volumes of meaningless data.

It is therefore an object of the present invention to provide a means to compact or compress non-informational data in a data stream.

It is another object of the present invention to provide a non-destructive means of reducing or eliminating non-informational data from a data stream allowing for the original signal to be reconstructed without error.

A further object is to compact non-informational data without expanding memory requirements or transmission facilities required to transmit informational data words in the event that substantially large proportions of the data stream actually carry valid data.

SUMMARY OF THE INVENTION

There is provided an apparatus which accomplishes compaction of data by counting non-informational data words in a data stream, increasing the count of consecutive concurrences of non-informational data words until the count equals a maximum value, or, until a non-zero informational word is detected, at which time, the value of the counter is transferred out of the system. If a non-zero informational word is detected in the data stream, the previously determined count of non-informational words is transmitted as an output to the system receiving data, followed by all consecutive valid data values. If the count of non-informational data words reaches a predetermined maximum value before a valid data word is detected, the maximum count value is sent and the non-informational data word counter is reset and begins counting consecutive non-informational data words. Only non-informational data word counts of one or more are ever transmitted.

Output data bytes from the invention, be they either the count of non-informational data words or actual valid data words, must have at least one extra data bit larger than the input data words being compressed to allow for a flag bit in the data word, the status of which indicates to a data processing system that accompanying bits are either data or a count of "zeroes".

DETAILED DESCRIPTION OF THE PREFERRED EMBODIMENT

Figure 1:
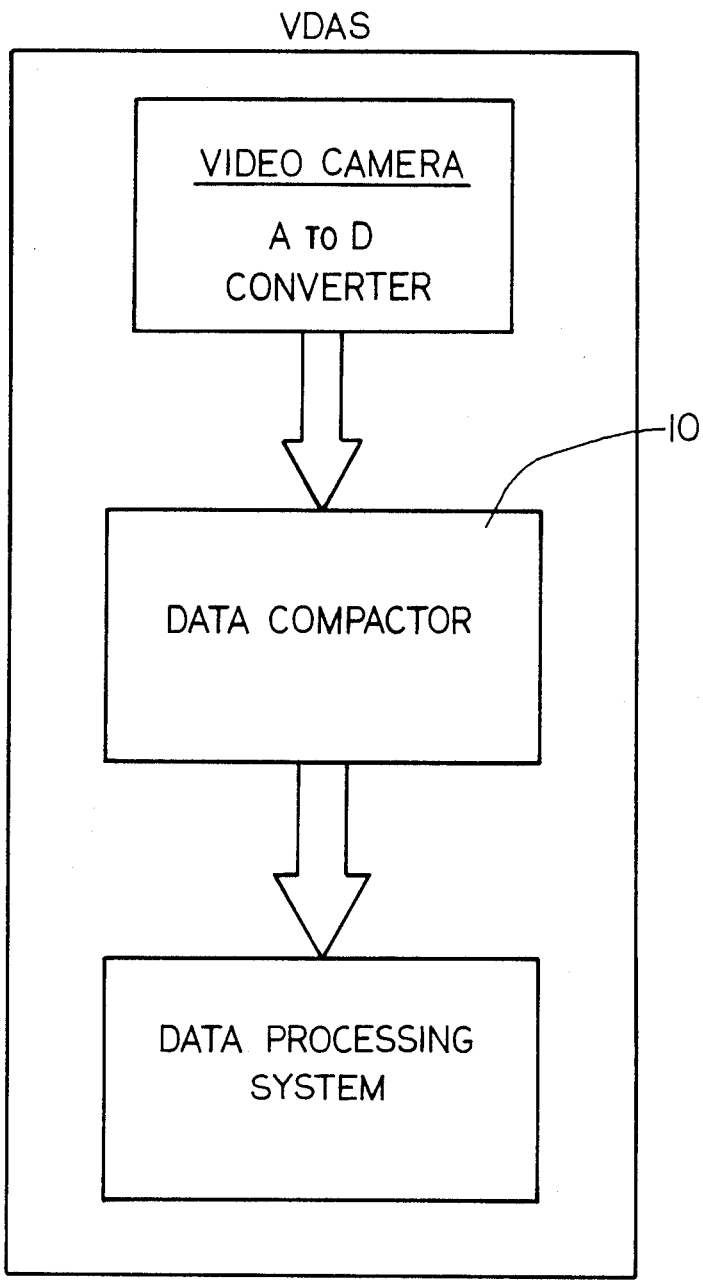
FIG. 1 is a system diagram showing use of the invention in a video data acquisition system as used at Fermilab.

Referring to FIG. 1, there is shown a block diagram of a video data acquisition system (VDAS) as used at Fermilab. Individual pixels from a video camera are digitized by a flash analog to digital converter, (ADC). Output bytes from the ADC, representing the digitized pixels from the camera, are sent to the data compactor 10. Digitized pixels from the camera which carry no meaningful information are suppressed from transmission to the data processing system by the data compactor, a count of their occurrences being sent with an appended flag digit instead. Digitized pixels which carry picture information pass from the data compactor appended with a predetermined flag digit, decoded by the data processing system.

Figure 2:
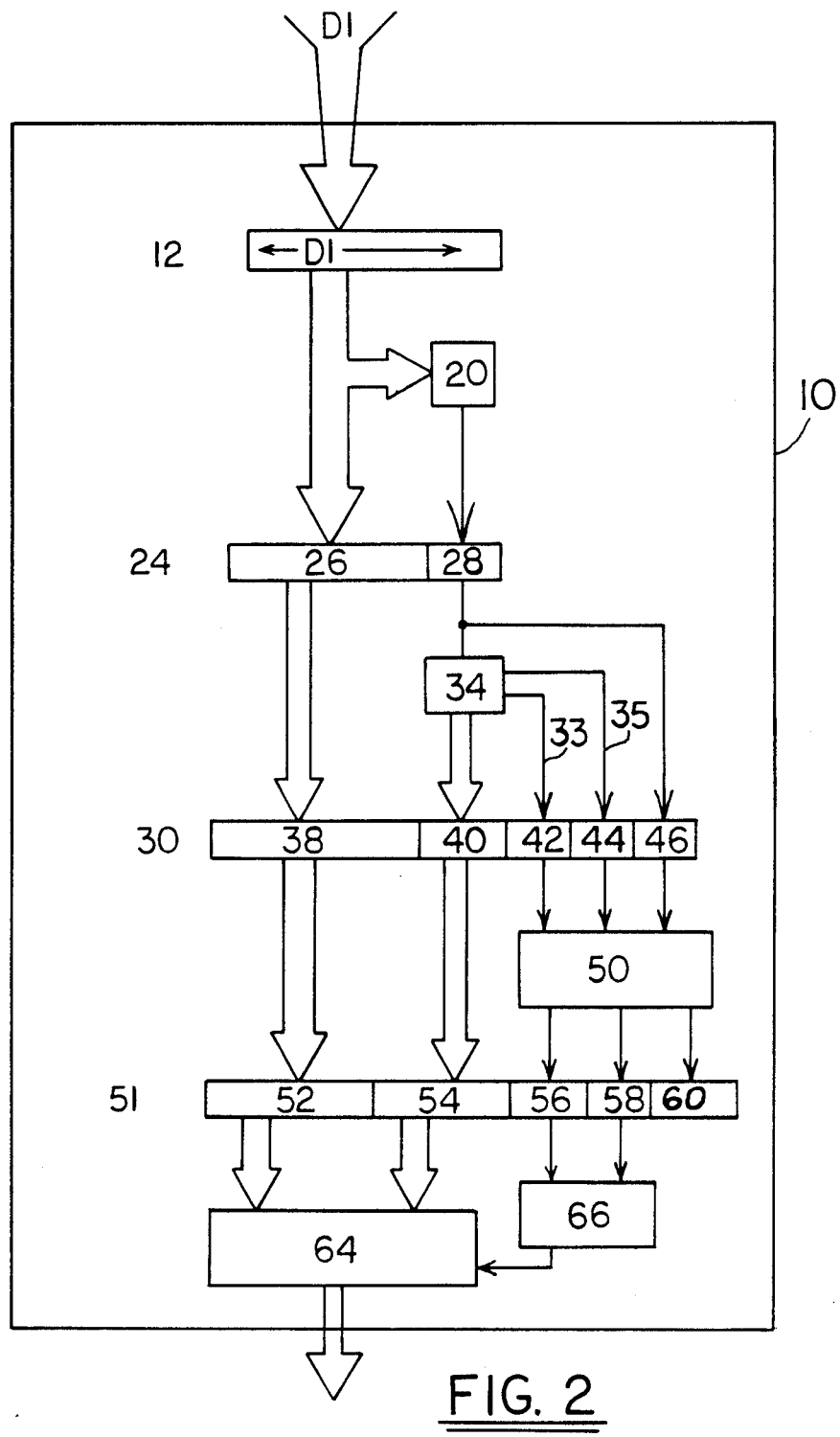
FIG. 2 shows a block diagram of functional elements of the invention.

Referring to FIG. 2, there is shown a functional block diagram of the preferred embodiment of the data compactor 10, comprised of essentially four, multi-bit registers or latches, a digital comparator, a loadable pre-setable counter, a multiplexer or mux as it is known in the art and various combinational logic devices associated with control blocks operate in a synchronous pipe-line fashion to continuously evaluate data words, count data words that carry no information and transmit either the valid words or the count of invalid data words to a data processing system. Digital data words from a data source that carry information pass through the circuit pipeline and are appended with a flag bit prior to transmission, which indicates that accompanying data bits are valid. Invalid data words from the data source pass partially through the pipeline up to a point at which their occurrence is counted continuously until a valid word is detected at which point a second valued flag bit is added to the count word, which is then transmitted to the data processing system. Data compaction can occur continuously, in real time at rates up to 100 megabytes per second using emitter coupled logic devices. Other logic families could be used allowing slower processing speeds where supply voltages, power consumption or other factors mandate different logic devices.

Four clock pulses, supplied by either the data source or alternatively derived directly from the data stream via another circuit, are required to move data words completely through the four synchronous registers or data latches 12, 24, 30 and 51 to a data processing system. Other synchronous elements for example, counter 34, load control block 50, strobe control 66 and mux 64, each must receive the same clock cycles or clock pulses as the data latches. In the description of the circuit which follows, a single data byte from a data source is tracked through the circuit shown in the Figure by discussing herein the state and operation of the various circuit elements shown in FIG. 2 before and after the four clock pulses, clock pulse one, or CP1 through clock pulse four, or CP4.

Referring to FIG. 2, a data word D1, in a stream of data words from a data source is clocked or latched into data latch 12, a six-bit D-type data latch, by clock pulse one, CP1. Valid data appears at the output of latch 12 at some later time determined solely by the internal gate delays of latch 12.

After data latched into data latch 12 is at the output of latch 12, the data is asynchronously tested against a predetermined threshold reference value by comparator 20. Comparator 20 tests the data in latch 12 to determine whether or not the data exceeds the threshold value or is less than or equal to the threshold value. Only data words in latch 12 that exceed the threshold value are considered to be informational data words, i.e. valid pixels. Data words that are less than or equal to the threshold value are considered non informational or "zeroes".

Comparator 20 is a two input, single output, binary comparator that compares the sign-plus-magnitude of two input binary words and asynchronously produces a logic one or zero as an output signal. In the preferred embodiment, comparator 20 produced a logic one when a data value in latch 12 exceeded the reference value. The reference value being the second input bit pattern to comparator 20, which is not shown in FIG. 1, may be switch selected or hardwired or dynamically varied under the control of another system such as a microprocessor.

Since the circuit of FIG. 1 is a synchronous pipe line architecture and the data clocked into latch 12 by clock pulse one, will be followed by another data word, which will be clocked into latch 12 by clock pulse two, the data in latch 12 at clock pulse one, is shifted into latch 24 at clock pulse two, as is the output bit of comparator 20 which is shifted into a single bit, bit field 28 of latch 24. Comparator 20 output must be stable and valid before the occurrence of the next clock pulse, CP2 which, as described, clocks new data into latch 12 and clocks old data previously in latch 12 and the output of comparator 20 into the second data latch 24, a seven bit latch divided into two bit fields a six bit, bit field 26 and a single bit, bit field 28.

Having shifted the data word obtained initially by CP1 into latch 12 and which was subsequently shifted into latch 24 by CP2 after CP2 occurs, the content of bit field 28 is evaluated by counter 34, which maintains a count of consecutive "zeroes" in the data stream.

Counter 34 provides a synchronous, loadable, resettable six-bit binary counter which counts consecutive occurrences of zeroes in the data stream. Counter 34 is updated upon occurrence of the third clock pulse CP3 to reflect the status of the bit field 28 obtained during CP2. After the second clock pulse CP2, counter 34 decodes the content of bit field 28 to determine whether or not the counter 34 should be incremented, cleared, or loaded with a binary one.

If counter 34 has not achieved its maximum attainable count value, i.e. not all ones, and if bit field 28 indicates that accompanying data bits in latch 24 are invalid data i.e. the data in latch in 24 is less than the threshold value, counter 34 is incremented at clock pulse three, to reflect the increased number of consecutive zeroes in the data stream. Logic circuits of counter 34 decode bit field 28 to cause counter 34 to increment by one at the next clock pulse.

If counter 34 has previously attained its maximum content after CP2, i.e. counter 34 is all ones after clock pulse 2 and if logic of counter 34 decodes the content of bit field 28 to indicate another invalid data word, combinational logic of counter 34 causes counter 34 to preload into counter 34 a binary one. At clock pulse 3, the previous maximum content of counter 34 is shifted to bit field 40 of latch 30 as the count value is updated in counter 34.

If, after clock pulse 2 occurs, counter 34 detects that bit field 28 indicates that valid data is present in bit field 26, counter 34 "zeroes" out the value of counter 34 at the next clock pulse CP3.

At clock pulse three, bit field 38 of latch 30 is always loaded with the original data byte previously held in data field 26 of latch 24. Similarly, the previous value of counter 34 is always shifted into bit field 40 and three status bits from counter 34 and bit field 28 are shifted into bit fields 42, 44, and 46 all with the occurrence of clock pulse three.

Referring to the three status bits in bit fields 42, 44, and 46, bit field 46 contains the status bit previously held in bit field 28. Status bits 42 and 44 contain output status bits from counter 34 which indicate whether or not the previous content of counter 34 was zero or all ones respectively.

As mentioned above, if after clock pulse two the content of counter 34 is "all ones", counter 34 previously established its maximum attainable count value.

An output line 35 of counter 34 identifies this condition prior to CP3 and produces an output status bit which is shifted into bit field 44 at CP3. When counter 34 has achieved its maximum count value, i.e. all ones and another invalid data word is following, (as indicated by status bit 28) the count of consecutive zeroes of the data stream is continued by preloading a binary one into the counter 34 at clock pulse three.

Counter 34 also provides a status bit on line 33 of counter 34 which is active in the event a valid data bit is detected by bit field 28. If after clock pulse two occurs, the content of bit field 28 indicates that valid data is present, counter 34 does not increment its count, rather, the previously attained count value, shifted into bit field 40 at clock pulse three, is zeroed at clock pulse three reflecting the presence of a valid data word in latch 24 at clock pulse 2 to be shifted into bit field 38 at clock pulse three. Status bit 42, provided by counter 34 indicates after CP3 that the count of counter 34 after clock pulse 3 is zero and that a valid data word is in latch 38, which is to be output to the processing system at clock pulse 4.

After clock pulse three, the content of data latch 30 are as follows:

bit field 38 contains the original data word D1;

bit field 40 contains the most recent count of consecutive zeroes in the bit stream;

bit field 42 contains a status bit indicating that a valid data word is present in bit field 38 when bit field 42 is active;

bit field 44 contains a status bit which, when active, indicates that the content of bit field 40 is its maximum value attainable, bit field 46 is a duplicate copy of the previous content of bit field 28. During the interval between clock pulse 3 and clock pulse 4, the load control block 50 decodes as status bits, bit fields 42, 44, and 46 and provides load control signals which are clocked into bit fields 56, 58, and 60 of latch 51 at clock pulse 4.

Since the scheme of data compaction is to transmit valid data words and count invalid data words, transmitting the count of invalid data words in place of the invalid data words themselves, bit fields 42, 44, and 46 after clock pulse 3 contain the information necessary to determine whether or not the content of bit fields 38 or 40, which are shifted into bit fields 52 and 54 at clock pulse 4 are to be transmitted to the user system as valid data or a count of invalid data words. Between clock pulse 3 and clock pulse 4, load control block 50 outputs one of at least two status bits to latch 51. If bit field 44 is active, the contents of bit field 40 of latch 30 must contain an all ones content and must be sent to the data processing system as a count of consecutive zeroes. If bit field 42 is active, a valid word was detected which was clocked into bit field 38 at clock pulse three. The previously obtained count of counter 34 resident at clock pulse three in bit field 40 must first be output to the data processing system at clock pulse 4. Thereafter, at the next clock pulse the valid data word detected and resident in bit field 38 at clock pulse 3, but shifted into bit field 52 at CP4 must be sent to the data processing system. If bit field 46 is inactive and if bit field 44 is inactive and if bit field 42 is inactive another invalid data word was detected by comparator 20, yet counter 34 has not yet been filled. The content of bit field 38 is therefore invalid data, the count of counter 34, which was incremented at clock pulse three is not yet maximum and neither the data in bit field 38 or 40 should be transmitted.

At clock pulse four, the output of load control block 50 is shifted into data latch 51 as two control bits resident in bit fields 56 and 58. Simultaneously with the transfer of control bits into bit field 56 and 58 the data bits previously resident in bit field 38 are shifted to bit field 52 the previously obtained count in bit field 40 is shifted to bit field 54. After clock pulse four, the strobe control block 66 decodes the content of bit field 56 and 58 to determine whether either the content of bit field 52 or 54 will appear at the output of multiplexer 64 with an appropriately valued flag digit. If a valid data word was detected as such by comparator 20 after clock pulse one, the output of comparator 20 being shifted into bit field 28 at clock pulse two, evaluated by counter 34 at clock pulse three and shifted into position at clock pulse four, the strobe control block 66 will load data from bit field 52 into the multiplexer 64 with an appropriate flag bit set in mux 64, the status of which indicates to a data processing system that accompanying data bits are valid data. If an invalid data word was detected at clock pulse one, the count of such invalid data words being incremented at clock pulse three, no data is output from the mux 64 after clock pulse four. The count of invalid data words is instead incremented until either the maximum count value of counter 34 is achieved in which case the maximum count value is sent or until a valid word is detected at which point the previously obtained count value is shifted out of mux 64 with a flag bit indicating to the data processing system that accompanying bits are at count value.

In the preferred embodiment data latches 12, 24, 30 and 51 were ECL data latches or emitter couple logic data latches selected for their maximum processing speed. Similarly counter 34, strobe control 66 load control 50 and mux 64 were emitter couple logic comparator 20 was selected to have a settling time sufficiently fast to accomodate a valid output between the successive clock pulses.

Where processing speeds are less critical, other logic families could be selected as discussed above. Functional equivalent of the circuit could be implemented using a program of a computer such as a microprocessor and appropriate software.

The embodiments of the invention in which a property right is claimed are as follows:

1. An apparatus for non-destructively compressing data in a stream of N-bit data words from a source of informational and non-informational data words, said apparatus comprised of:

comparison means coupled to the data source for comparison testing N-bit data words in said data stream against a predetermined N bit binary threshold value, said comparison means being capable of generating at least binary output signals indicative of the result of said comparison test;

a counter means coupled to said comparison means for forming a count word of N binary digits, said counter means responsive to said comparison means so as to form an N bit binary count of consecutive N-bit data words from said data source having a magnitude less than said threshold value;

first flag bit means coupled to said comparison means and said counter means for forming a first (N+1) bit digital word which includes a first valued binary flag digit appended to such of said N bit data words from the data source exceeding said threshold value;

second flag bit means coupled to said comparison means for forming a second (N+1) bit digital word which includes a second valued binary flag digit appended to such of said N-bit count word, said second flag bit means responsive to said counter means and to said comparison means to form a N+1 bit data word upon the occurrence of either the attainment of a predetermined count value by said counter means or upon the detection by said comparison means of an N-bit data word from the data source exceeding said threshold value;

means coupled to said first flag bit means and said second flag bit means for selectively transmitting to a data processing system either said first N+1 bit word or said second N+1 bit word;

whereby said selectively transmitted (N+1) bit data words are recognizable by said first and second valued flag digits as being either an N bit data word from the data source above said threshold value or an N-bit count of data words from said data source below said threshold value, the original N-bit data stream being reconstructable from said (N+1)-bit words by a data processing system.

2. The apparatus of claim 1 where said comparison means for comparison testing N bit digital data words in said data stream against a predetermined N-bit binary threshold includes a N bit data latch and an N-bit binary comparator.

3. The apparatus of claim 2 where said first flag bit means for forming a first N+1 bit words is comprised of a N+1 binary digit data latch responsive to said first data latch and comparator.

4. The apparatus of claim 3 where said means for selectively transmitting to a data processing system either said first N+1 bit word or said second N+1 bit word includes a load control means, responsive to said comparison means, said counter means, said first flag means and said second flag means, another N+1 bit data latch and N+1 bit data multiplexor responsive to said load control means.

5. The apparatus of claim 4 where said source of said N-bit data words is a digitized output signal from a video camera.

6. A method for non-destructively compressing data in a stream of N-bit data words from a source of informational and non-informational data words comprised of;

comparison testing each N-bit data word in said stream against a predetermined N-bit binary threshold value and generating a binary output signal, the value of which indicates the result of said test, counting in an N-bit count word consecutive ocurrences of failures of said comparison test, up to a maximum count of $(2^N)-1$ occurrences;

forming a first (N+1)-bit data word by appending a first valued flag digit to the N-bit data words that pass said comparison test;

forming a second (N+1)-bit word by appending a second valued flag digit to said N-bit count word upon the occurrence of either the attainment of a predetermined count value or the occurrence of a N-bit data word that passes said comparison test;

selectively transmitting either said first (N+1)-bit word or said second (N+1)-bit word upon the occurence of either the occurrence of an N-bit word passing said comparison test or the attainment of said maximum count value, whereby said selectively transmitted (N+1)-bit data words are recognizable by said first and second flag digits as being either an N-bit count of data words from the data source failing said comparison test or an N-bit word from said data source passing said comparison test.

* * * * *